(12) United States Patent
Fish et al.

(10) Patent No.: US 6,952,576 B2
(45) Date of Patent: Oct. 4, 2005

(54) ENTERTAINMENT DEVICE HAVING A CONTENT LIBRARY AND ADAPTIVE CONTENT SELECTION

(75) Inventors: Robert Fish, Gillette, NJ (US); Mahfuzur Rahman, South Brunswick, NJ (US); Chieh-Chung Chang, Plainsboro, NJ (US); Dennis Bushmitch, Somerset, NJ (US); Stephen Johnson, Erdenheim, PA (US); David Braun, Denville, NJ (US); Luyang Li, Bordentown, NJ (US)

(73) Assignee: Matsushita Electric Industrial Co., Ltd., Osaka (JP)

( * ) Notice: Subject to any disclaimer, the term of this patent is extended or adjusted under 35 U.S.C. 154(b) by 798 days.

(21) Appl. No.: 09/935,035

(22) Filed: Aug. 22, 2001

(65) Prior Publication Data

US 2003/0040293 A1 Feb. 27, 2003

(51) Int. Cl.[7] ............................................... H04M 3/42
(52) U.S. Cl. ................................................ 455/414.01
(58) Field of Search .................................... 455/414.01

(56) References Cited

U.S. PATENT DOCUMENTS

| | | | | |
|---|---|---|---|---|
| 4,750,213 A | * | 6/1988 | Novak ........................ 455/3.01 |
| 4,805,217 A | | 2/1989 | Morihiro et al. |
| 5,126,982 A | | 6/1992 | Yifrach |
| 5,625,464 A | | 4/1997 | Compoint et al. |
| 5,671,195 A | | 9/1997 | Lee |
| 5,911,029 A | | 6/1999 | Sakaguchi et al. |
| 5,930,444 A | | 7/1999 | Camhi et al. |
| 6,067,278 A | * | 5/2000 | Owens et al. ................ 704/270 |
| 6,449,359 B1 | * | 9/2002 | Luzzatto et al. ........ 379/373.01 |
| 6,483,428 B1 | * | 11/2002 | Fish et al. ................. 340/425.5 |
| 2003/0054802 A1 | * | 3/2003 | Xie ............................. 455/412 |

FOREIGN PATENT DOCUMENTS

| | | |
|---|---|---|
| EP | 0901248 A2 | 3/1999 |
| GB | 2258102 A | 1/1993 |

OTHER PUBLICATIONS

European Search Report, Nov. 20, 2002.

* cited by examiner

*Primary Examiner*—Creighton Smith
(74) *Attorney, Agent, or Firm*—RatnerPrestia

(57) ABSTRACT

An entertainment device is provided for adaptively tuning to a content signal. The entertainment device includes a receiver responsive to content signals provided to the entertainment device. A selected channel of the receiver provides an output signal to an output terminal of the automobile entertainment device. A data processor is operably linked to the receiver for receiving a signal index of the content signal. The data processor is responsive to a predetermined signal index for actuating the receiver to select the specific channel corresponding to the predetermined signal index. A memory stores the predetermined signal index in accordance with an operator preference. Thus, the predetermined signal index enables the entertainment device to adaptively adjust to an operator's preferred content.

18 Claims, 4 Drawing Sheets

ENTERTAINMENT DEVICE HAVING A CONTENT LIBRARY AND ADAPTIVE CONTENT SELECTION

BACKGROUND OF THE INVENTION

The present invention relates to an entertainment device, and, more particularly, to an automobile entertainment device for storing content and adaptively selecting content in accordance with an operator's entertainment preferences.

Automobile entertainment devices, sound systems in particular, provide a means for playing recorded media or means for tuning to an available radio broadcast while operating an automobile. Typically, an operator utilizes a control interface of the automobile entertainment device to play pre-recorded media, to select from "preset" radio stations or to manually scan available radio broadcast stations to search for desired content.

With the advent of cellular phones, beepers, personal digital assistants (PDA's) and the like, safety concerns are increasingly limiting the amount of time/attention an automobile operator can afford such devices. Indeed, some jurisdictions have banned the use of cellular phones while driving to preclude inattentiveness and careless driving. While the operation of automobile entertainment devices is a commonly accepted practice while driving, compact, contemporary device designs and increased functionality may cause a driver to spend more time than necessary operating such a device while driving.

For example, a driver may take his eyes from the road to select a compact disc (CD) for play in the automobile entertainment device, or to scan manually through a radio broadcast band for desired content. As automobile entertainment devices are more compact, smaller displays, buttons, etc., often times, the driver must divert his view from the roadway for several seconds to properly operate the device.

The inability to record desired content leads to further operator distraction as an operator may try to operate a phone, beeper, or the like while simultaneously attempting to listen to desired content. For example, a driver seeking desired content or a scheduled program currently has no means to record a program while temporarily exiting the vehicle or engaging in conversation. Similarly, where two programs are simultaneously available (i.e., a broadcast source), an operator has no readily available means to store content from one source while listening to content of another source.

SUMMARY OF THE INVENTION

An automobile entertainment device is provided in which an adaptive content selection system is programmed to adapt to an operator's programmed preferences and enable storage of a first program while accessing a second, or temporarily storing a program portion while the operator is otherwise engaged.

An entertainment device is provided for adaptively tuning to a content signal. The entertainment device includes a receiver responsive to content signals provided to the entertainment device. A selected channel of the receiver provides an output signal to an output terminal of the automobile entertainment device. A data processor is operably linked to the receiver for receiving a signal index of the content signal. The data processor is responsive to a predetermined signal index for actuating the receiver to select the specific channel corresponding to the predetermined signal index. A memory stores the predetermined signal index in accordance with an operator preference. In this way, the predetermined signal index enables the entertainment device to adaptively adjust to an operator's preferred content.

According to one aspect of the invention, the signal index value provides information needed to locate the desired content from the content source (e.g. broadcast channel and time or CD track) as well as title information for display on a jukebox menu. Signal indexes are derived from a content directory database that, as described below, is downloaded and may be developed from several sources.

Further, the present invention provides an automobile entertainment device for adaptively selecting a content signal. The device includes at least two receivers responsive to content signals provided to the automobile entertainment device. A selected one of the at least two receivers provides an output signal to an output terminal of the automobile entertainment device.

Still further, the present invention provides a memory for storing the predetermined signal index in accordance with an operator preference and for receiving content, such as the signal of the unselected one of the at least two receivers.

Additionally, the present invention provides access to the content of the unselected one of the at least two receivers stored in memory at a rate greater than the normal data rate. If the content of the unselected one of the at least two receivers is in the process of being stored, and the operator actuates the unselected one of the at least two receivers, content can be accessed from the memory at the greater rate until the content being stored in the memory is contemporaneous (i.e., real time) with data received at the unselected receiver.

BRIEF DESCRIPTION OF THE DRAWINGS

These and other features, aspects, and advantages of the present invention will become more fully apparent from the following description, appended claims, and accompanying drawings in which:

DESCRIPTION OF THE PREFERRED EMBODIMENT

Certain terminology used in the following description is for convenience only and is not limiting. The term "automobile entertainment device" as used herein refers to a media player typically found in an automobile, boat, motorcycle and the like for reproducing sound and/or video from recorded media and/or re-producing signals transmitted to a receiver thereof. The term "content" as used herein refers to any audio and/or video data provided to the device, including purely instructional data. The term "selected receiver" as used herein refers to a receiver providing content directly to an operator of the entertainment device via output terminals of the device.

The present invention provides an automobile entertainment device. The automobile entertainment device includes an adaptive content selection system programmed to adapt to an operator's programmed preferences. Additionally, the automobile entertainment device enables the storage of available content, such as storing a first program while listening to a second, or temporarily storing a program portion while the operator is otherwise engaged.

Figure 1:
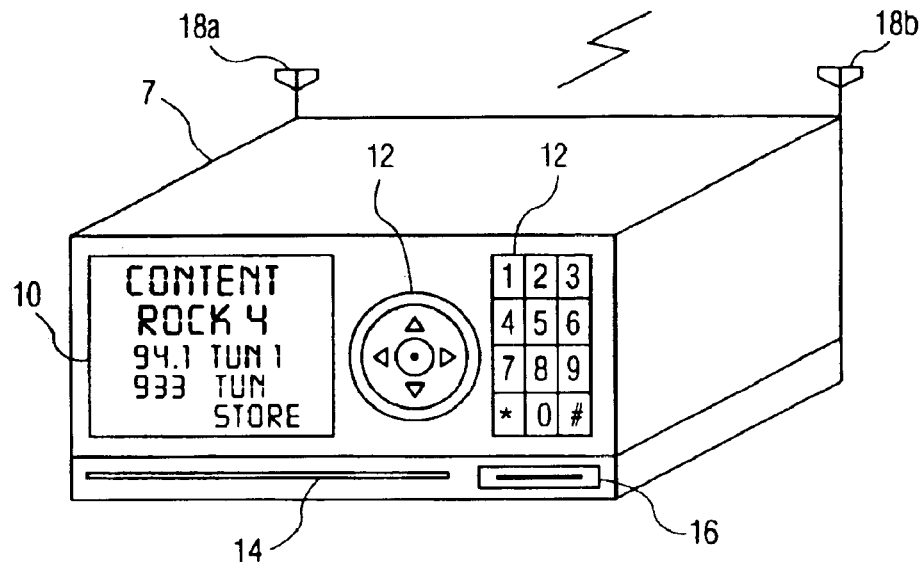
FIG. 1 is a perspective view of an automobile entertainment device in accordance with the present invention.

Referring now more specifically to the drawings, FIG. 1 shows a perspective view of an exemplary automobile entertainment device (AED) 7 in accordance with the present invention. The AED 7 includes display 10, controls 12, media interface 14, content exchange port 16, and antennas generally designated 18. While antennas 18a and 18b are shown as separate structures, the exemplary embodiment may employ a single antenna. The graphical depiction of separate antenna 18a and 18b is not limiting, and is used only to illustrate the functionality of separate receivers (described herein).

In an exemplary embodiment, the AED 7 is operably linked to an instrument panel of a vehicle (i.e., vehicle electrical system not shown) for receiving a power signal and providing an audio and/or video output signals to sound and/or video output components (also not shown). Although described in terms of a vehicular/mobile system, those skilled in the art will recognize that the present invention is generally applicable to any entertainment device.

In an exemplary embodiment, display 10 of AED 7 may be a liquid crystal display (LCD). The display 10 provides visible indicia of selected control parameters and the status of the AED 7. In an exemplary embodiment, the display 10 may further provide video images for viewing analog and/or digital video signals. In this alternative embodiment, the AED 7 may employ video processing circuitry for presenting the video signal to the display 10. Additionally, the circuitry may include an on screen display (OSD) circuit for providing textual data to the display such that menu options are visible even during a video presentation.

The AED 7 includes control panel or "controls" 12. The controls 12 of the AED 7 provide an operator means for adjusting and/or entering control parameters to provide or adjust output signals therefrom. In an exemplary embodiment, the controls 12 are illuminated push-button or shuttle type switches, however those skilled in the art will recognize that the function of controls 12 can be performed by any number of switching technologies including "touch-screen" technology, via display 10, or transmitted control parameters provided to AED 7 via a wireless communication device (not shown). Similarly, controls 12, may be integral with a vehicle electrical system and placed on the steering wheel or other conveniently accessible locations. Control functions may also be implemented using a speech recognition module (SRM) that recognizes and implements commands that are spoken by the operator or a passenger in the vehicle.

The media interface 14 is provided for reading pre-recorded media. In an exemplary embodiment, the media interface 14 may allow the AED to read DVD's and CD's (including DVD-ROMs and CD-ROMs) or a connector adapted to receive content data from such a medium. Those skilled in the art will recognize that media interface 14 may employ any number of technologies and carriage assemblies for reading a pre-recorded media unit (not shown)

The AED station 7 includes a content exchange interface 16. In the exemplary embodiment, the interface 16 may be a uniform serial bus (USB) port. Those skilled in the art recognize that the interface 16 can be any number of known hardware interfaces and/or configured be any number of known data transfer protocols such as IEEE 1394 (Firewire) or wireless protocols such as infrared. For example, interface 16 may operably link to an MP3 player, CD-ROM, personal computer (PC), or Secure Digital (SD) memory type device for importing/exporting content to the AED 7. The input interface 14 may also be configured to receive audio-visual data (A/V) from such devices as video-cassette recorders and/or digital versatile disc (DVD) players.

In the exemplary embodiment, the antennas 18 receive broadcast content. Those skilled in the art will recognize that antenna structures 18a and 18b may be omitted where content is provided via direct connection to AED 7. In the exemplary embodiment, however, broadcast content is provided to AED 7 via radio frequency (RF) transmission; of course, digital broadcast sources, satellite transmissions, etc may also be received by antenna 18.

Thus, in use, a receiver of the AED 7 is responsive to content signals provided thereto. A selected channel of the receiver provides an output signal to an output terminal of the automobile entertainment device. A data processor (described herein) of the AED 7 is operably linked to receive a signal index of a desired content signal. The data processor is responsive to a predetermined signal index for actuating the receiver to select the specific channel corresponding to the predetermined signal index. A memory stores the predetermined signal index in accordance with an operator preference. In this way the predetermined signal index enables the AED 7 to adaptively adjust to an operator's preferred content.

The AED 7 may also employ a second receiver to adaptively select a channel of a second content source. Moreover, a channel of the AED 7 may be stored in memory while the operator accesses another channel for output from the AED 7.

The memory of AED 7 enables an operator to store content to create a content library, "pause" live broadcasts (i.e., buffering content until pause is deactivated), fast forward or rewind through buffered content or stored content to skip or repeat the content that is currently being played using controls 12.

I. Main Components

Figure 2:
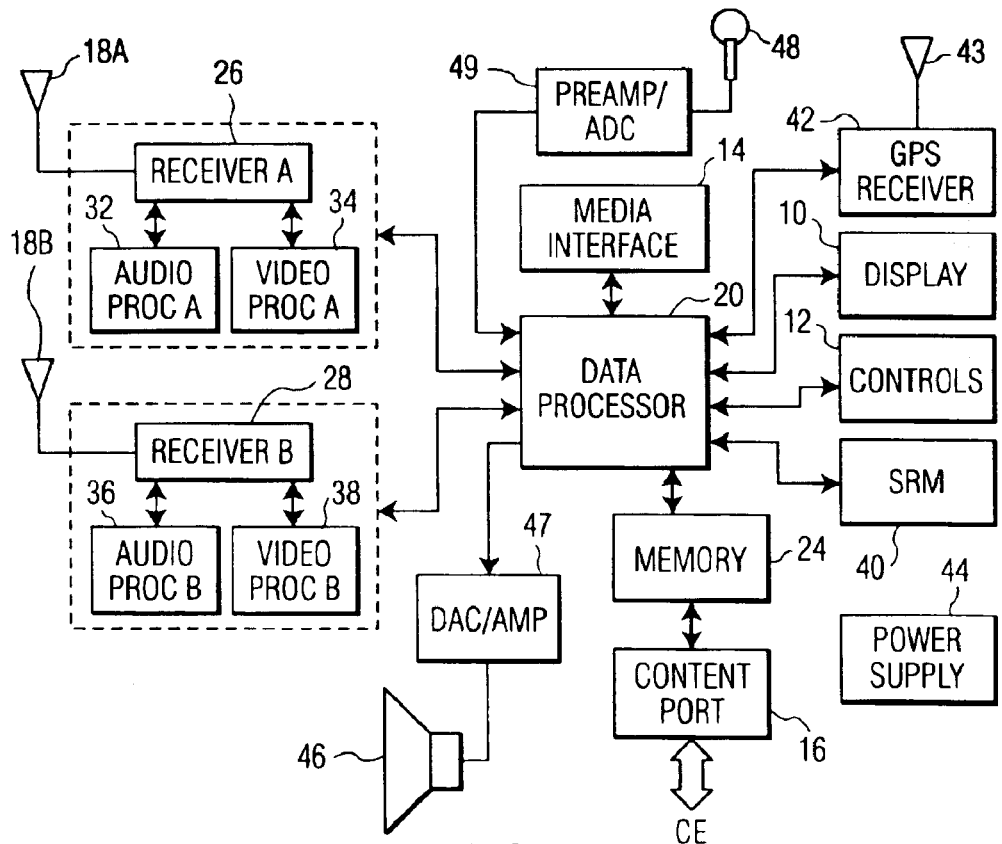
FIG. 2 is a high level block diagram of the exemplary automobile entertainment device of FIG. 1.

Referring now to FIG. 2, a high level block diagram of an exemplary AED 7 is shown. In an exemplary embodiment, AED 7 includes data processor 20, memory 24, receiver(A) 26, receiver(B) 28, amplification section 30, audio processor 32, video processor 34, audio processor 36, video processor 38, speech recognition module (SRM) 40, global positioning system (GPS) receiver 42, power supply 44, digital to analog converter (DAC)/amplifier 47, speaker 46, preamplifier/analog-to-digital (ADC) 49 and microphone 48. For the sake of simplicity, connections between the various components of AED 7 and the power supply 44 are not shown.

In the exemplary embodiment, the receiver(A) 26 receives audio and or AV signals from a transmission source (not shown) for processing by audio processor 32 and video processor 34. As will be known to those skilled in the art, the video processing circuitry of receiver(A) 26 of the exemplary embodiment may include circuitry for receiving analog or digital signal transmissions. The function of the receiver(A) 26 is to decode the digital or analog transmission into the appropriate signals for processing by the corresponding audio and/or video processor 32 and 34 respectively. For example, the audio processor 32 and video processor 32 may process an audio/video bitstream, encoded, for example, according to the standard specified by the Advanced Television Systems Committee (ATSC). The exemplary system decodes the digital bitstream to present the decoded signals to an output terminal of AED 7 (not shown), and/or, in the case of video, to display 10 of AED 7 and DAC/amplifier 47 and speaker 46.

Typically, the AED 7 receives a digital AV signal from a transmission source, media interface 14, content port 16, or memory 24 and demodulates the digital signals or processes the analog signals to recover the audio and/or video information. In the case of digital content, the receiver(A) 26 may perform real time audio and video decompression of various data streams (bitstreams) communicated to the device to recover the audio and/or video data. Additionally, the exemplary receiver 26 may also recover control data such as a signal index to identify the content of the signal. For example, the signal index may include such data items as the title of the content, start time of the transmission, stop time of the transmission and a content category.

In the exemplary embodiment of the invention shown in FIG. 2, the audio processing section 32 includes audio amplification and decoding circuitry. It may also include circuitry for receiving analog or digital signals stored in memory 24 or provided to AED 7 from a broadcast source through the receiver(A) or through the content port 16. The audio processing section 36 is redundant to audio processing section 32. The purpose of audio processing section 36 is to enable the receiver(B) 28 to operate independently of the receiver(A) 26. When the AED 7 stores digital signals, the audio processing sections 32 and 36 and the video processing sections 34 and 38 may include coder-decoders (codecs) (not shown) that compress received content for storage into the memory 24 and decompress the content that is retrieved from the memory so that it may be presented to the user. If the AED 7 is configured to receive digital content data, either from prerecorded media or from a digital broadcast, the audio and video processing sections may record the data as it is received, if the received format is compatible with other data stored in the memory 24, or it may include a transcoder (not shown) that translates the received digital content data into the format used to store the data in the memory 24. Although not shown, it is contemplated that the audio and video processors may access the memory 24 via dedicated ports or using a direct memory access (DMA) facility.

As explained above, the receiver(B) 28 is redundant with receiver(A) 26. The separate receivers (A) and (B) enable the AED 7 to receive content from independently tuned channels simultaneously. For example, an operator may receive content of receiver(A) 26 while storing the content of receiver(B) 28 to memory 24. Similarly, the operator may switch, or schedule to switch, between receivers upon detecting more desirable content at an unselected receiver. For example, the AED 7 of the exemplary embodiment may monitor the content of one and/or both of receiver(A) 26 and receiver(B) 28 in accordance with operator preferences stored in memory 24. If an operator is listening to a signal of receiver(A) and more desirable content is detected at another channel of receiver(A) or a separate broadcast band/content source of receiver(B), the AED 7 selects the more desirable content. This adaptive tuning may be performed instantaneously, or, after a predetermined selection period in which the operator may choose to manually bypass this feature when alerted of the detected content via display 10 or speaker 46. In the exemplary embodiment, content is determined to be desirable when comparing signal index data of the receivers 26 and 28 with the operators stored preferences.

The description of receiver(B) 28, audio processor 36 and video processor 38 is identical to the description above of receiver 26, as such, further description of receiver (B) is omitted for the sake of brevity.

In an exemplary embodiment, the receivers 26 and 28 may employ only audio processing circuitry for use as an automobile sound device or "radio." In this way, audio processors 32 and 36 include appropriate tuning circuitry to process the digital or analog audio data. When digital audio information is received, the audio processor 32 and/or 34 may include a digital-to-analog converter (DAC) (not shown) that converts the digitized the audio data to analog audio data.

The data processor 20 communicates control information with media interface 14, memory 24, receivers 26 and 28, amplification section 30, SRM 40, control interface 12 and GPS receiver 42 as indicated via the solid lines. In addition, the data processor 20 is coupled to the audio processors 32 and 36, the video processors 34 and 38, the preamplifier/ADC 49 and the DAC/amplifier 47. The solid double-ended arrow Ce, designates the content exchange function of the AED 7 with an external device (not shown). Specifically, the data processor 20 provides control data to the various components and receives data from the components as indicated, The data processor 20 also manages access to memory 24. The data processor 20 may determine, for example, responsive to an operator selection, which transmitted or stored program is to be decoded/processed and/or displayed. Using this information the processor 20 controls the receiver to tune or access the channel or section of memory 24 that contains the desired program. The data processor 20 may also select among channels for accessing content in accordance with an operator's preference stored in memory 24.

The memory 24 of AED 7 is provided for receiving and storing content. Content can be transferred to the main memory 24 from a transmitted source via receiver(A) and/or (B), via pre-recorded media by way of media interface 14, or via content port 16. The memory 24 may include dedicated storage space for operational data such as lookup tables, operator preferences and the like. In the exemplary embodiment, the main memory 24 is a non-volatile memory such as a hard disk or flash memory. In one embodiments, memory 24 may be an SD memory module. The memory 24 may also employ, for example, an encryption scheme, such as the algorithm for content protected secure media (CPRM). In the exemplary embodiment, a portion of memory 24 is reserved for use by the SRM 40.

In the exemplary embodiment of FIG. 2, the DAC/amplifier 47 includes audio amplification circuitry for providing an output signal to the speaker 46. In an exemplary embodiment, the amplifier 47 may include circuitry known to those skilled in the art for such functions as impedance matching, amplitude and/or frequency modulation, noise suppression, electrical isolation, wave shaping and the like (not shown). The audio and video signals input to the amplification section 30 are provided from receiver(A) 26, receiver(B) 28, memory 24, media interface 14, microphone 48, or content port 16. If for example, SRM data is provided from microphone 48 via the preamplifier/ADC 49 and the processor 20, the preamplifier/ADC 49 may include a compressor preamplifier to ensure that even relatively low-level sounds can be digitized by the ADCs and processed by the audio processor 32 or 36.

In the exemplary embodiment, local power supply 44 is a rechargeable power supply such as a nickel-metal hydride or lithium ion cell. In the exemplary embodiment the power supply 44 of AED 7 may be recharged by connecting a port of the AED 7 (not shown) to a source of power, such as an automobile power adapter (also not shown). In an alternative embodiment, the AED 7 may be recharged during operation (i.e., by direct connection to an automobile power source).

Microphone 48 is provided for detecting audio input sound to AED 7. In an exemplary embodiment, the microphone 48 provides spoken utterances from an operator to speech recognition module 40 (SRM) for converting the spoken utterances into control commands for controlling AED 7 as described herein. Of course, microphone 48 may also be utilized for recording content such as dictation to memory 24 in the usual manner.

In the exemplary embodiment, speaker 46 of AED 7 both provides content to the use and alerts the user of desired content (adaptive selection) in accordance with an operator preferences stored in memory 24. Upon receiving the alert for a predetermined period, the operator may choose to disregard the more desirable content by manually overriding the adaptive selection via controls 12 or by a spoken command via microphone 48 and SRM 40. In addition, the user may disable the content alert features of the invention.

The SRM module 40 of the exemplary embodiment is responsive to an input audio signal for dynamically converting the audio data into recognized control commands. Generally, the microphone 48, via the ADC/preamp 49 and data processor 20, provides audio signals to an input port of the SRM module 40 for processing. The SRM module 40 performs signal filtering to identify audio segments including speech components and to separate the speech segments from the audio input. The SRM module 40 then processes the speech signals through filters to identify various components which are applied to speech models, such as hidden Markov models to convert the audio input into "phonemes" or speech parts. The phonemes are sent to a word matcher, which selects a matching word from a word database stored in memory 24 based on the identified phonemes of each word. The selected database word is then output from the SRM 40 for conversion to a control command by data processor 20. As described above, video processor 34 or 38 may also be employed for displaying text corresponding to the control parameters on the display 10. The exemplary word database includes a context module that distinguishes between homophones such as "to," "too" and "two." An exemplary SRM suitable for use with the present invention is described in U.S. Pat. No. 5,822,728 entitled MULTI-STAGE WORD RECOGNIZER BASED ON RELIABLY DETECTED PHONEME SIMILARITY REGIONS.

In an exemplary embodiment, a GPS receiver 42 is provided for use with display 10, microphone 48 and speaker 46. In the exemplary embodiment, GPS signals are received by GPS receiver 42 and a map appropriate for the geographic location of AED 7 is shown on display 10. Those reasonably skilled in the art will recognize that GPS receivers are well known in the art, as such the description of such is omitted. Speaker 46 may be employed in the exemplary embodiment for giving audible indications of GPS signals. For example, an audible tone or spoken alert may be given to operators approaching known landmark/destination or the operator may be given audible directions to a landmark/destination.

Further, In the exemplary embodiment, microphone 48 and speaker 46 can be used in conjunction with the GPS receiver 42 and/or for communicating with a concierge service of an automobile manufacturer such as the ONSTAR® system.

Any number of the above modules of AED 7 may be omitted for producing a low cost AED 7. For example, it may be desirable to eliminate SRM 40 and GPS receiver 42.

Figure 3A:
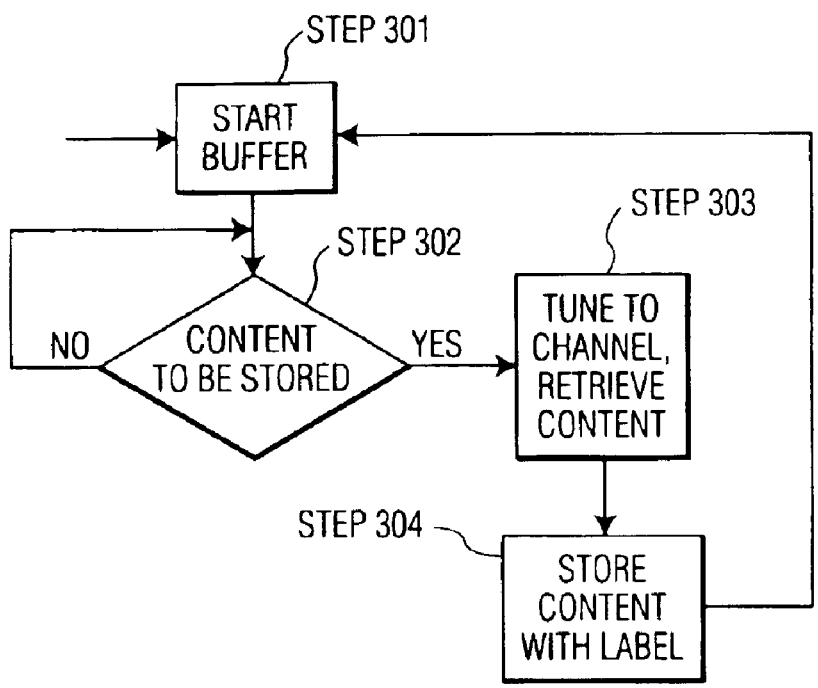
FIG. 3A is a flow chart illustrating the operation of the content buffer in accordance with the present invention.
Figure 3B:
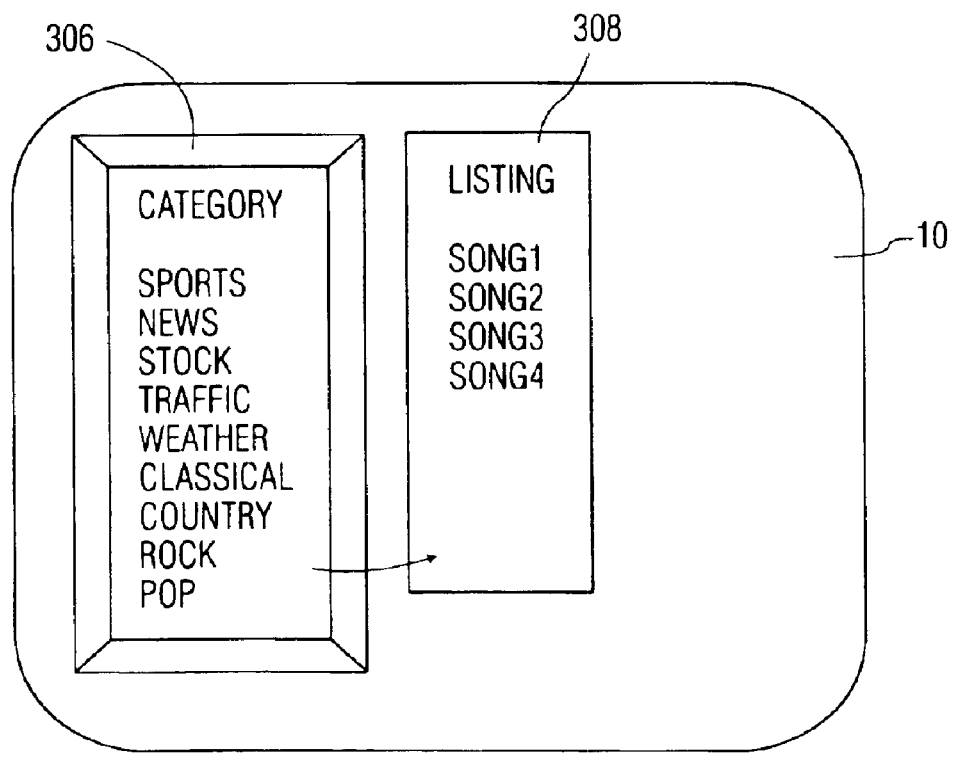
FIG. 3B is a sample display of a user interface for indexing and listing content.
Figure 4:
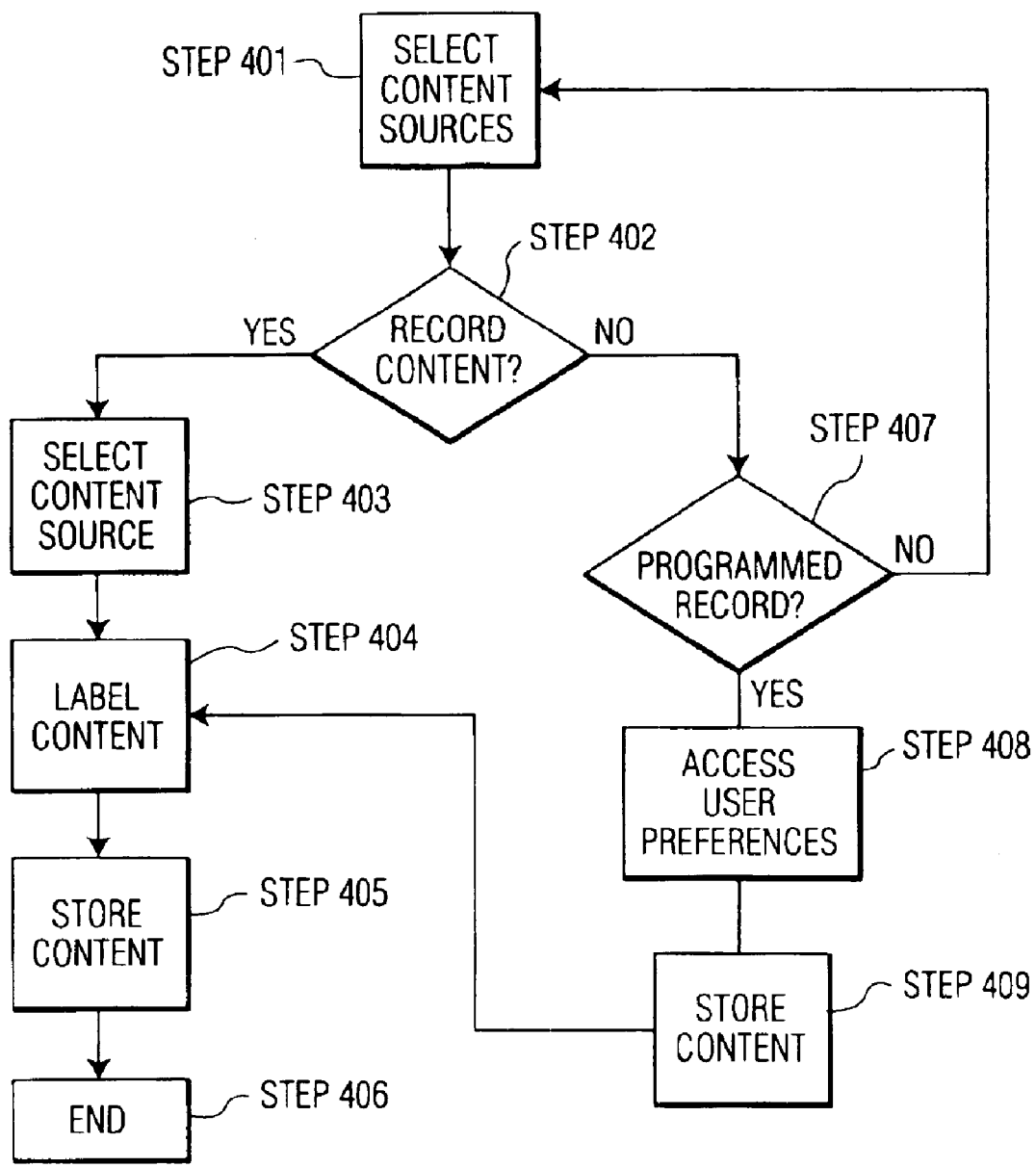
FIG. 4 is a flow chart illustrating the operation of recording the content of one channel while accessing another channel.
Figure 5:
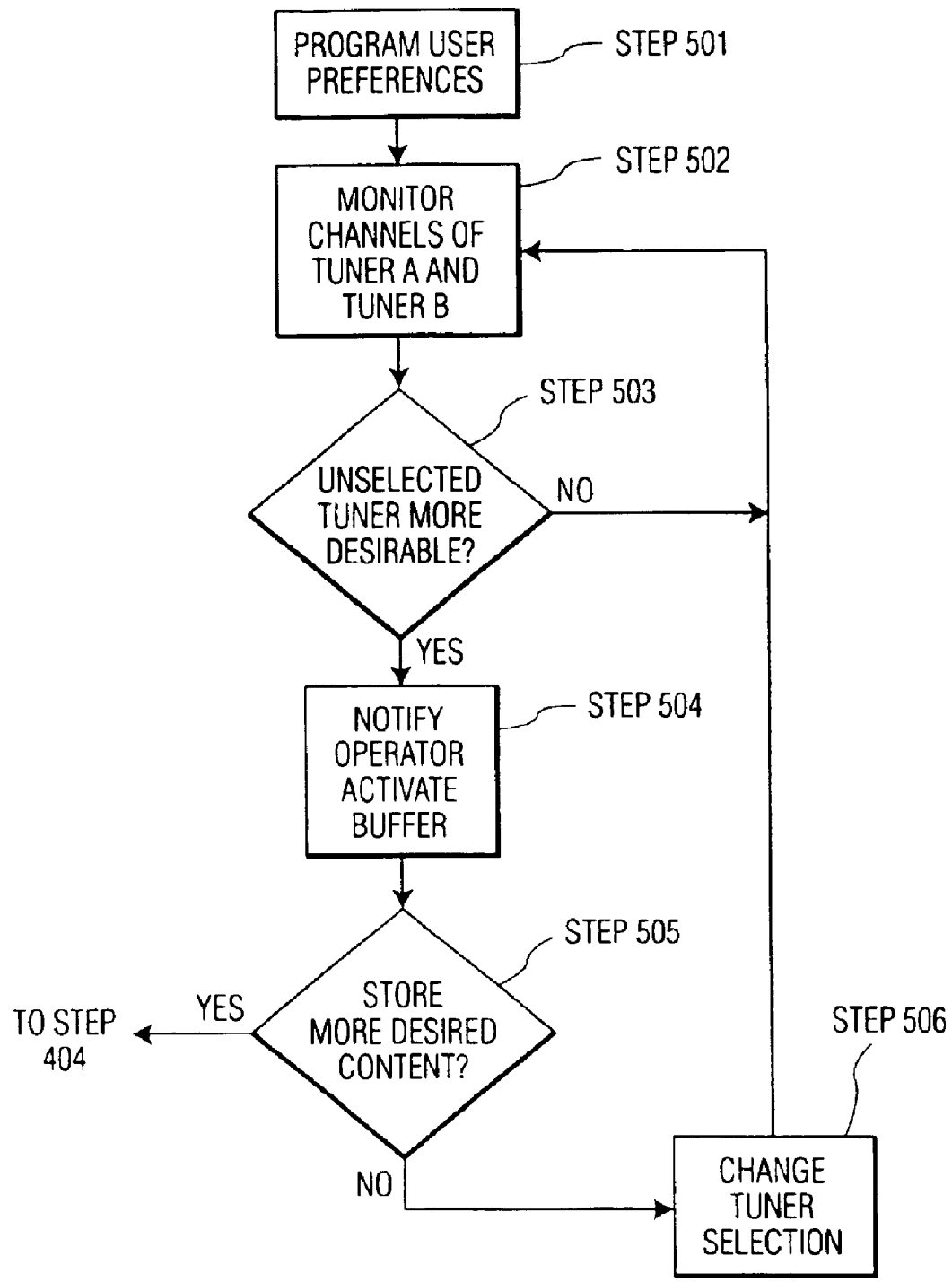
FIG. 5 is a flow chart illustrating the operation of adaptive selection in accordance with the present invention.

The adaptive selection and user storage functionality of AED 7 are described in conjunction with the flowcharts of FIGS. 3–5.

II. AED Content Storage (Library)

This feature of the invention allows a user/operator to build a database of content that he or she prefers to listen to or view. To use this feature, the user may enter preferences for one or more content categories, for example, a particular musical group, artist or type of programming. For example, the user may enter the band Monkey Bus®, sports news and political talk shows. The system, using a signal index directory downloaded from the content provider, as described below, automatically tunes the tuner that is not being used to the appropriate station when any of the user's preferred content is being broadcast. This content is compressed and recorded into the memory 24, as described above and entered into a directory such as that shown in FIG. 3B. The user may access this directory at any time to play items that are stored in the memory 24 as a personal "jukebox." A user may mark a particular stored item as not to be erased. Otherwise, the system erases the oldest stored item when a new item of interest becomes available. It is contemplated that each of the different categories may be allocated a predetermined amount of memory so that the jukebox always has a variety of items.

This feature of the invention may use a content directory that is downloaded from the content provider to determine what programs are being transmitted at any given time. This directory may be dedicated to a particular service, such as a satellite radio service, or FM radio broadcast, or it may be a more encompassing directory that includes, for example, programming information for all of the broadcast stations and satellite services that are available in a particular region. The directory may also be a combination of individual directories derived from respectively different services and assembled by the AED 7. If the service provides digital programming, (e.g. MPEG encoded video) the directory may be transmitted as separate digital packets in a packetized digital stream. If the signal being received is an analog signal, the directory may be transmitted using a modulated subcarrier signal (e.g. an SCA signal) that does not interfere with program content on the analog signal. The AED 7 builds the directory database from these signals over time and periodically accesses the digital data stream or subcarrier signals to update the contents of the database. Alternatively, the directory may be provided on removable media such as a CD-ROM or DVD-ROM.

Referring now to FIG. 3A, the operation of the AED 7 is shown as a flow chart in accordance with an exemplary embodiment of the invention. The flowchart of FIG. 3A shows the method of storing content received at a selected receiver. At step 301 a buffer section of memory 24 is selected into which the next item will be recorded. The buffer section enables the temporary storage of content. The system, at step 302 then compares the operator's list of preferences to the programming currently being broadcast, as determined from the directory database. If none of the operator's preferred content is available, the process continuously loops through step 302. When such content is detected, step 303 tunes the receiver that is not currently being used, to the channel carrying the desired content and, at step 304, compresses and stores the content with an identifying label into the selected buffer. This label may be derived from the entry in the directory database for the content. After the content is stored, control returns to step 301 to select the next buffer.

As described above, the AED 7 may record the information so that the jukebox always has a variety of content. Thus, each category may be allocated a predetermined number of buffer areas and the buffer areas allotted to each content category may form a circular queue, with each new entry in the category overwriting the oldest entry for that category. In this alternative embodiment, the buffer into which the new content is recorded at step 304 would replace the buffer with the oldest content in the category of the newly recorded content.

When the operator wants to use the "jukebox," he or she accesses the jukebox menu using the controls 12 of the AED 7. In response to this command the AED 7 displays the current jukebox menu on the display 10. FIG. 3B is an exemplary jukebox menu. As shown, the menu includes a category list 306 and a sublist 308 of recorded content in the particular category. The operator scrolls down the category list 306 to display the recorded items for a particular category and then scrolls down the listed items to select one to be played.

Also, the operator may manually record content into the jukebox memory. For example, where an operator tunes to a radio broadcast station via receiver(A) 26 and a favorite recording is broadcast, he or she can enter a command that causes the buffer to capture the recording immediately upon tuning, and the operator is given the opportunity to store the content in memory 24 for later enjoyment. When the operator manually records the content, the signal index for the recorded content is stored with the operator preferences such that when similar programming is provided (e.g. a later edition of the same news program or another song by the same recording artist), the operator is notified by the content notification system, described below.

III. Dual Channel Recording and Reproduction

Referring now to FIG. 4, the operation of the AED 7 is shown as a flow chart in accordance with an exemplary embodiment of the invention. The flowchart of FIG. 4 shows the method of storing content received at an unselected content source such as a receiver while providing the output of a selected content source to an output port of the AED 7. At step 401 an operator selects receiver(A) 26, receiver(B) 28, media interface 14 or content port 16 to provide content to an output terminal (not shown) of the AED 7 in accordance with the present invention. Also in step 401, the operator may select or schedule the storage of content from one or more of the unselected content sources. At step 402, the operator is prompted (via display 10 or speaker 46) to indicate whether an un-selected source of content is to be stored in memory 24. If the operator wishes to record a currently available content source, at step 403, the operator selects that content source via controls 12 in conjunction with a displayed menu of display 10. At step 404, if the operator desires to store the content, the operator is prompted via display 10 to enter a label through controls 12 of AED 7.

In the exemplary embodiment, the content may be written to a previously existing location in memory 24 to overwrite an existing file. At step 405, the content is stored in memory 24 of AED 7, the process ends at step 406. If the operator does not want to record a presently available content source in step 402, the operator may schedule to store a content source which will be available at a later time (i.e., a scheduled broadcast) in step 407. Of course, if the operator does not wish to store any content, the process loops back to step 401. Where the content to be stored is scheduled, the data processor 20 accesses user preferences stored in memory 24 in step 408 to schedule the storage. In the exemplary embodiment, the user preferences may include a signal index, channel designation, title start time, stop time and the like. At step 409, the content is stored in memory 24 and the process continues to step 404 as described above. An identifier for the content is also stored in the memory to enable the system to generate the jukebox display as shown in FIG. 3B.

For example, an operator may insert a pre-recorded media such as a compact disc (CD) into AED 7 to be read by media interface 14 (i.e., selected content source). The operator may then, through controls 12 and display 10 store a broadcast signal of receiver(A) 26 in memory 24 for later playback. In the exemplary embodiment, if the operator finishes with the prerecorded media prior to the end of the broadcast of the unselected source, he may switch to the unselected source. In this way, the storage of unselected content acts like a "pause" function. When the unselected source becomes selected the storage continues. However, the memory 24 may be accessed to reproduce its stored contents, for example, at 1.5×the normal data rate or greater such that content can be accessed from the memory 24 until the content being stored in the memory 24 is contemporaneous with data received at the unselected tuner. In this way, the operator can speed through stored information to "catch-up" with the real time broadcast content. Additionally, where the stored content includes commercial advertisements, the operator through controls 12, may choose to further increase the playback rate for brief intervals in order to bypass or fast-forward past such commercial content.

IV. Adaptive Selection

Referring now to FIG. 5, the operation of the AED 7 is shown as a flow chart in accordance with an exemplary embodiment of the invention. The flowchart of FIG. 5 shows the method of adaptively tuning/selecting a content source. At step 501, an operator provides preferences to memory 24. In the exemplary embodiment, the preferences may include performing artist names, content titles, etc. Where more than one artist or type of content is listed, the artists and content types may be weighted according to preference such as most desirable to least desirable. Additionally, a particularly undesirable or content source may be listed such that channels carrying such broadcasts are locked out or instantaneously switched when present, this feature enables parents to preclude certain artists or channels from access to children. A security code may be used in conjunction with the operator preferences to secure access thereto.

At step 502 of FIG. 5, the AED 7 monitors the directory for the variable content sources such as receiver(A) 26 and receiver(B) 28. If at step 503, more desirable content is detected the process proceeds to step 504, otherwise the process continuously loops to step 502. At step 504, the operator is alerted via display 10 or speaker 46 that more desirable content is presently available. In step 504, the operator may choose to store the more desirable content (i.e., FIG. 4) rather than switch content sources. Additionally, the buffer of FIG. 3 is activated so as not to lose any content prior to permanent storage. If after a predetermined time the operator does not manually override the notification, the process proceeds to step 505. At step 505 the operator may proceed to permanently store (i.e., non-buffer storage) the content in memory 24 as outlined in steps 404–406 of FIG. 4. If the operator does not wish to store the unselected content, the process proceeds to step 506. At step 506, the adaptive tuning is initiated and the unselected source becomes the selected source.

For example, a user defines the band Monkey Bus® a desired content source. While the user is listening to the content of a channel of receiver(A) 26, he/she may be notified that a Monkey Bus® song is presently available on another channel of receiver(A) 26 or available through receiver(B) 28 (i.e., on a separate broadcast band). The user may decide to temporarily store the Monkey Bus® song in memory, switch to the Monkey Bus® song, or override the feature. Similarly, where the content is undesirable, the unselected channel carrying the objectionable content may be rendered temporarily unaccessible. Where the objectionable content is a selected source (i.e., broadcast channel airing adult material), the adaptive tuning may select without warning a predetermined default channel such as an all news station stored in the operator preferences for avoiding the access to the objectionable content. Information on particular content available on any of the tunable media may be provided from a directory database, as described above.

Although the exemplary system is described in terms of a hardware implementation, it is contemplated that some or all of the hardware functionality may be practiced entirely in software running on an AED system. This software may be embodied in a carrier such as magnetic or optical disk or a radio frequency or audio frequency carrier wave.

It will be understood that various changes in the details, materials, and arrangements of the parts which have been described and illustrated above in order to explain the nature of this invention may be made by those skilled in the art without departing from the principle and scope of the invention as recited in the following claims.

What is claimed:

1. An automobile entertainment device for receiving and presenting user preferred content signals, comprising:
   a receiver responsive to content signals provided to the automobile entertainment device to provide an output signal representing user preferred content to an output terminal of the automobile entertainment device;
   a data processor operably linked to the receiver for receiving a signal index of the user preferred content signal, the signal index identifying content of the user preferred content signal, the data processor being responsive to the signal index for actuating the receiver to receive the preferred content signal; and
   a memory for storing the received preferred content signal and the signal index,
   whereby the stored signal index enables the automobile entertainment device to automatically receive and record the preferred content.

2. An automobile entertainment device according to claim 1, wherein the memory includes a plurality of sections, each section corresponding to a respectively different category of content and the predetermined signal index includes a respective indicator for each category of content.

3. An automobile entertainment device according to claim 2, wherein the memory further includes a content directory indicating attributes of content that the receiver is able to receive and the processor compares the respective signal indexes to cause the receiver to receive the preferred content signal.

4. An automobile entertainment device according to claim 3, wherein each of the sections of the memory has a predetermined size and new content recorded into the section replaces the stored content that has been in the section longer than any other content in the section.

5. An automobile entertainment device according to claim 1, wherein the memory stores a further signal index corresponds to undesirable content, wherein the data processor is responsive to the further signal index to inhibit the receiver from providing content represented by the further signal index.

6. An automobile entertainment device according to claim 1, further including a command interface that converts spoken commands into control signals for the automobile entertainment device.

7. An automobile entertainment device according to claim 1, further including a command interface configured to be mounted on a steering wheel of an automobile in which the automobile entertainment device is located.

8. An automobile entertainment device for receiving and presenting content signals, comprising:
   at least first and second tuning devices for receiving the content signals provided to the automobile entertainment device, the first tuning device providing an output signal to an output terminal of the automobile entertainment device;
   a data processor operably linked to the at least first and second tuning devices for receiving a signal index representing a user preferred content signal, the data processor being responsive to the signal index for actuating the second tuner to receive the preferred content signal; and
   a memory for storing the received preferred content signal and the signal index,
   whereby the stored signal index enables the automobile entertainment device to receive and record the preferred content automatically using the second tuner while the first tuner is providing the output signal to the output terminal of the automobile entertainment device.

9. An entertainment device according to claim 8, wherein the memory further includes a content directory indicating attributes of content that the receiver is able to receive and the processor compares the respective signal indexes to cause the receiver to receive the preferred content signal.

10. An entertainment device according to claim 8, further including first and second content processors for processing the content signals received by the first and second receivers, each of the first and second content processors being coupled to the output terminal of the entertainment device, to the memory and to the data processor, whereby one or both of the first and second receivers provides received content signals to the memory while one of the first and second receivers provides content signals to the output terminal.

11. An automobile entertainment device for receiving and presenting user preferred content signals, comprising:
   a receiver responsive to content signals provided to the automobile entertainment device for receiving the preferred content signals
   a memory for storing the received preferred content signals,
   content processing means coupled to the receiver and to the memory for processing the received preferred content signals and providing an output signal representing user preferred content signals to an output terminal of the automobile entertainment device; and
   a data processor operably linked to the receiver, to the memory and to the content processing means for receiving a signal index of the user preferred content signal, the signal index identifying content of the user preferred content signal, the data processor being responsive to the signal index for actuating the receiver to receive the preferred content signal, and for selecting one of the received content signal and the stored content signal to provide to the content processing means.

12. An automobile entertainment device according to claim 11, wherein the data processor causes the memory to store the content at a predetermined rate and controls the content processing means to provide the content stored in the memory at a rate greater than the predetermined rate.

13. An automobile entertainment device according to claim 11, wherein the memory includes a plurality of sections, each section corresponding to a respectively different category of content and the predetermined signal index includes a respective identifier far each category of content.

14. An automobile entertainment device according to claim 13, wherein the memory further includes a content directory indicating attributes of content that the receiver is able to receive and the processor compares the respective signal indexes to cause the receiver to receive the preferred content signal.

15. An automobile entertainment device according to claim 14, wherein each of the sections of the memory has a predetermined size and new content recorded into the section replaces the stored content that has been in the section longer than any other content in the section.

16. An automobile entertainment device according to claim 11, wherein the memory stores a further signal index corresponds to undesirable content, wherein the data processor is responsive to the further signal index to inhibit the receiver from providing content represented by the further signal index.

17. An automobile entertainment device according to claim 11, further including a command interface that converts spoken commands into control signals for the automobile entertainment device.

18. An automobile entertainment device according to claim 11, further including a command interface configured to be mounted on a steering wheel of an automobile in which the automobile entertainment device is located.

* * * * *